(12) United States Patent
Kolodin et al.

(10) Patent No.: US 7,635,869 B2
(45) Date of Patent: Dec. 22, 2009

(54) SUPPORT WITH RECESSED ELECTRICALLY CONDUCTIVE CHIP ATTACHMENT MATERIAL FOR FLIP-CHIP BONDING A LIGHT EMITTING CHIP

(75) Inventors: Boris Kolodin, Beachwood, OH (US); Michael Hsing, Sanchong (TW); Stanton Earl Weaver, Jr., Northville, NY (US); Ivan Eliashevich, Maplewood, NJ (US); Srinath K. Aanegola, Broadview Heights, OH (US)

(73) Assignee: Lumination LLC, Valley View, OH (US)

( * ) Notice: Subject to any disclaimer, the term of this patent is extended or adjusted under 35 U.S.C. 154(b) by 114 days.

(21) Appl. No.: 11/520,905

(22) Filed: Sep. 14, 2006

(65) Prior Publication Data

US 2008/0067537 A1   Mar. 20, 2008

(51) Int. Cl.
*H01L 33/00* (2006.01)
(52) U.S. Cl. .................... 257/79; 257/778; 257/783; 257/E33.057
(58) Field of Classification Search .................. 257/99, 257/E33.057, 79, 414, 431–433, 734, 778, 257/782, 783
See application file for complete search history.

(56) References Cited

U.S. PATENT DOCUMENTS 6,060,729 A * 5/2000 Suzuki et al. ................. 257/99

| 6,479,759 | B2 | 11/2002 | Ferling et al. |
| 6,720,664 | B1 | 4/2004 | Teng et al. |
| 2002/0007962 | A1* | 1/2002 | Ferling et al. ............ 174/252 |
| 2002/0121706 | A1* | 9/2002 | Tatsuta et al. ............ 257/778 |
| 2003/0045015 | A1 | 3/2003 | Slater, Jr. et al. |
| 2004/0016873 | A1* | 1/2004 | Kida et al. ............ 250/214 R |
| 2004/0203189 | A1* | 10/2004 | Chen et al. ............ 438/108 |
| 2005/0225973 | A1* | 10/2005 | Eliashevich et al. ....... 362/217 |
| 2005/0253159 | A1 | 11/2005 | Creswick |

FOREIGN PATENT DOCUMENTS

DE    198 29 197 A1    1/2000
EP      0 854 520 A    7/1998

* cited by examiner

*Primary Examiner*—Lynne A. Gurley
*Assistant Examiner*—Vernon P Webb
(74) *Attorney, Agent, or Firm*—Fay Sharpe LLP

(57) ABSTRACT

In a light emitting device, a light emitting chip (12, 112) includes a stack of semiconductor layers (14) and an electrode (24, 141, 142) disposed on the stack of semiconductor layers. A support (10, 10', 110, 210) has a generally planar surface (30) supporting the light emitting chip in a flip-chip fashion. An electrically conductive chip attachment material (40, 41, 141, 142) is recessed into the generally planar surface of the support such that the attachment material does not protrude substantially above the generally planar surface of the support. The attachment material provides electrical communication between the electrode of the light emitting chip and an electrically conductive path (36, 36') of the support. Optionally, at least the stack of semiconductor layers and the electrode of the light emitting chip are also recessed into the generally planar surface of the support.

21 Claims, 7 Drawing Sheets

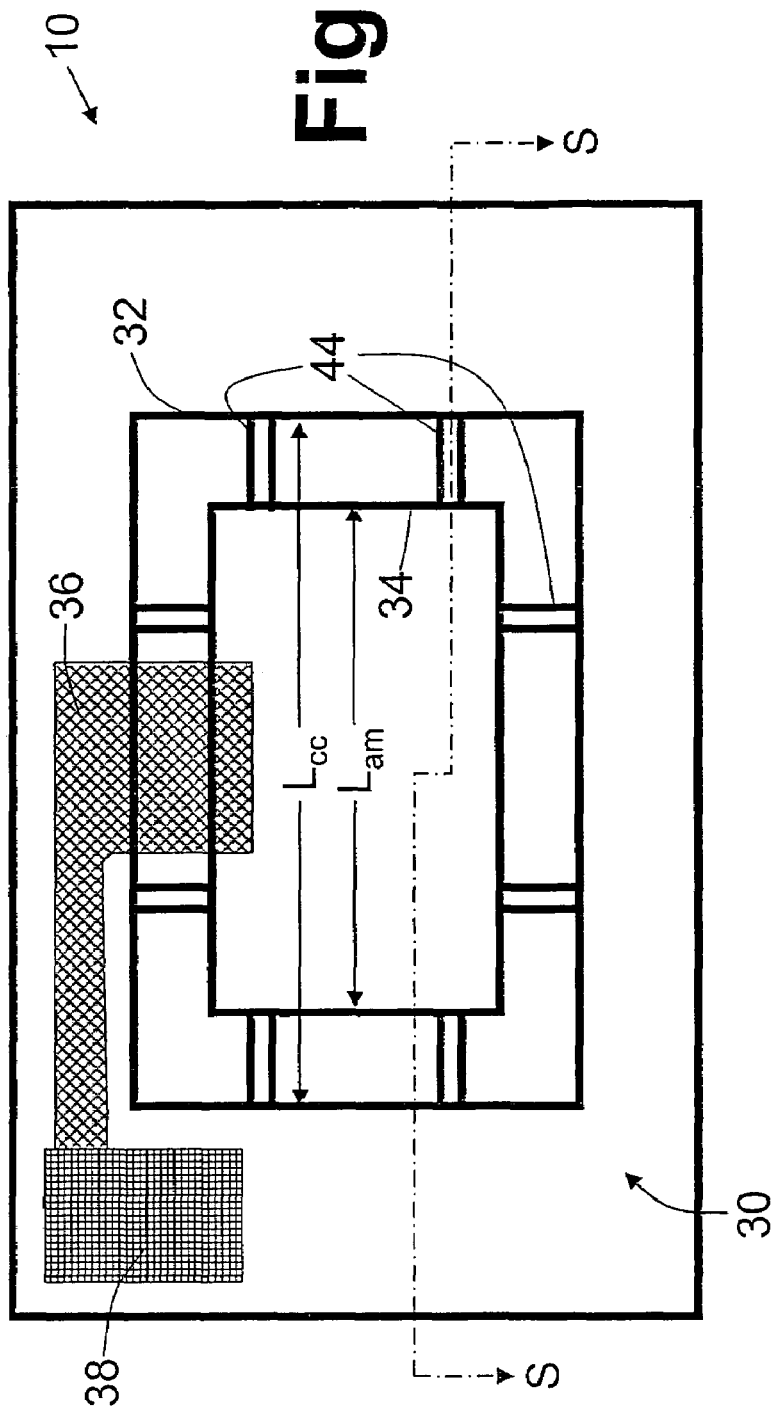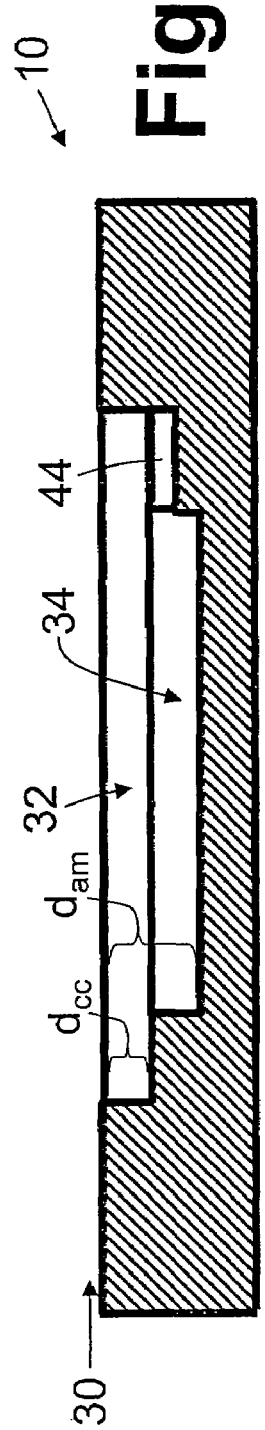

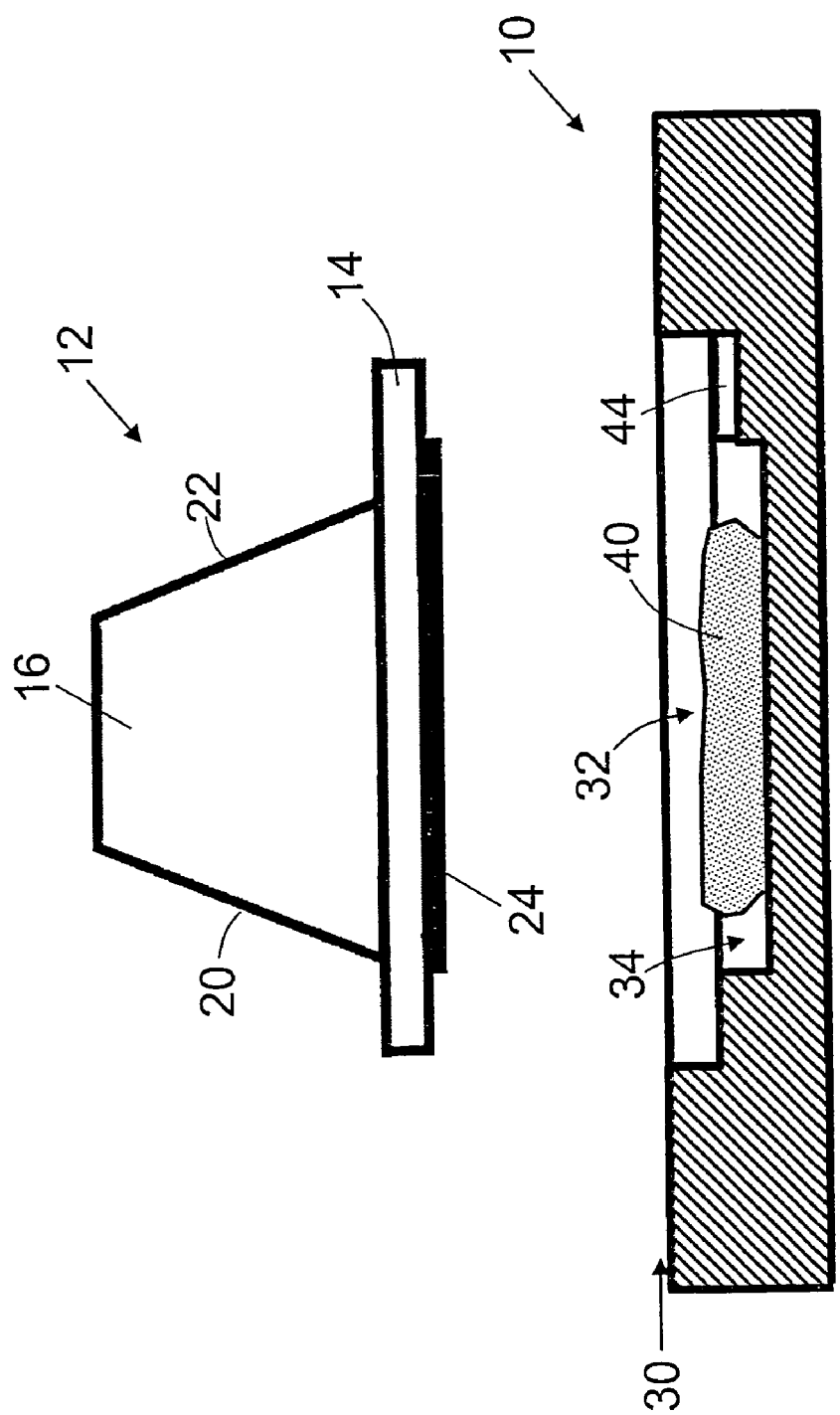

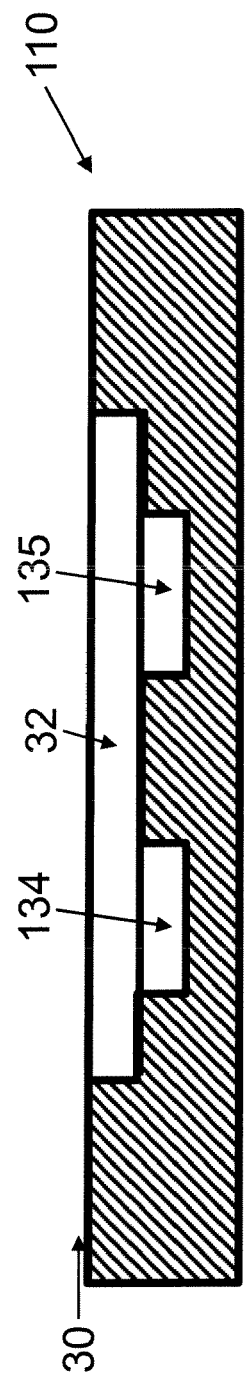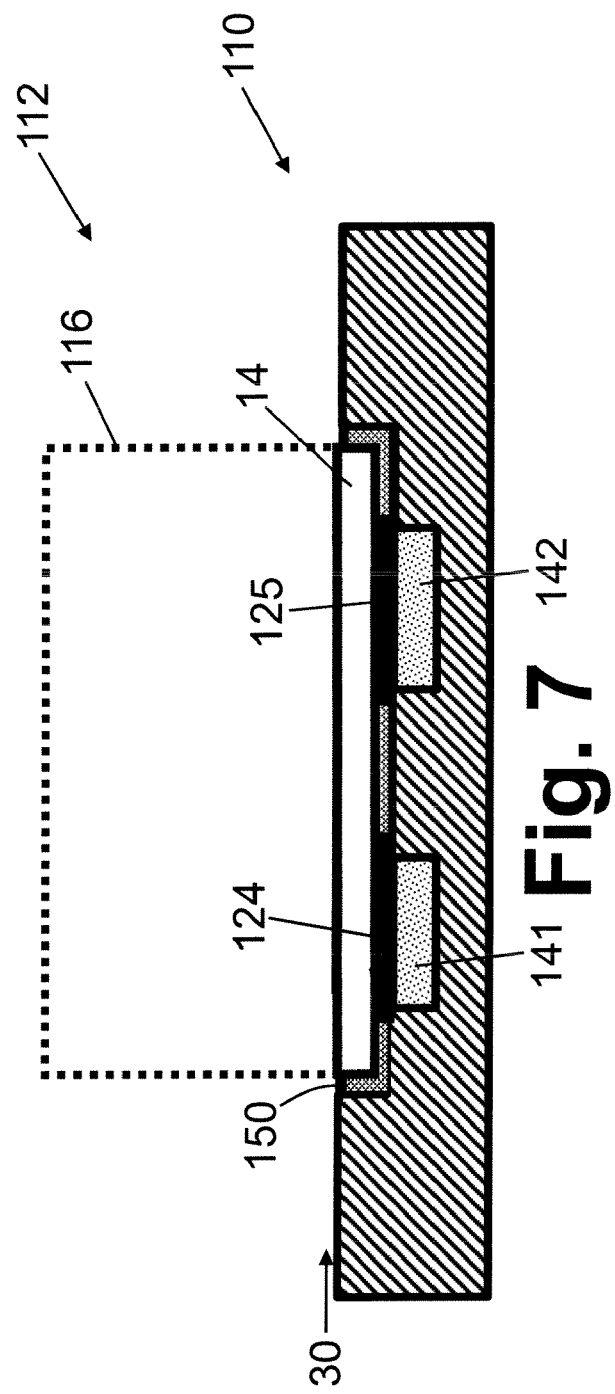

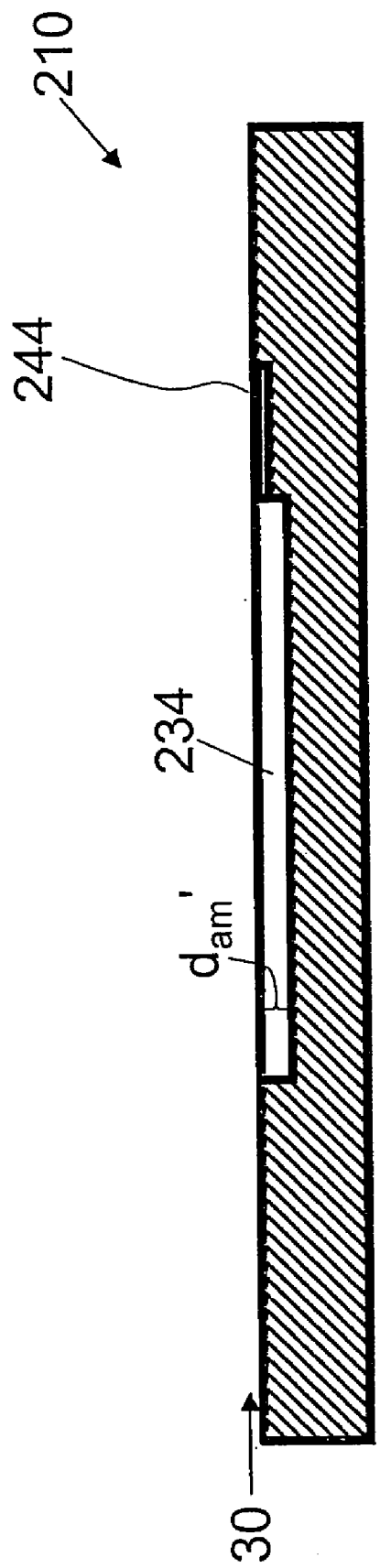

SUPPORT WITH RECESSED ELECTRICALLY CONDUCTIVE CHIP ATTACHMENT MATERIAL FOR FLIP-CHIP BONDING A LIGHT EMITTING CHIP

BACKGROUND

The following relates to the light emission, lighting, illumination, and related arts. Example illustrated embodiments relate to mounting and packaging of light emitting diode chips. However, the following is amenable to other similar applications, such as mounting and packaging of vertical cavity surface emitting laser chips, organic light emitting chips, and so forth.

A light emitting diode chip typically includes a substrate on which a stack of semiconductor layers is deposited epitaxially or otherwise formed. The stack of semiconductor layers define a pn junction configured to emit light when suitably electrically energized. Typically, processing operations such as lithography, metallization, passivation, and so forth are applied to define electrodes for electrically energizing the chip. In a vertical chip design, electrodes are formed on opposite sides of the chip, that is, on the stack of semiconductor layers and on the substrate (or on the "backside" of the stack of semiconductor layers if the substrate is removed, for example by laser lift-off). In a lateral design, electrodes are formed only on the stack of semiconductor layers.

In the flip chip bonding technique, the chip is bonded in "flipped" fashion with the stack of semiconductor layers bonded to the sub-mount or other mounting surface, and the substrate arranged away from or distal from the sub-mount or other mounting surface. The generated light passes through the substrate, which should in such a design be light transmissive, and is emitted. In some embodiments, the substrate is removed after the flip chip bonding, for example by a laser lift-off process, in which case the substrate can be either light transmissive or opaque. For vertical designs in which the substrate is retained, the substrate should also be electrically conductive.

The flip chip bonding process has certain difficulties that adversely affect yield, reliability, and other device performance aspects. In the case of flip chip mounting of a vertical chip, potential exists for the solder to seep out of the gap between the chip and the sub-mount and contact a chip sidewall or the substrate, producing parasitic losses or, in extreme cases, failure of the device due to shorting. Such migration of the solder material can occur during placement of the chip, or during subsequent solder reflow. Indeed, some vertical chip manufacturers advise against flip chip bonding using soldering, and instead recommend other techniques such as thermocompressive or thermosonic bonding. These techniques are typically more complex than soldering, and may involve separate application of compressive or sonic energy to each individual chip.

In the case of lateral chips, soldering is also problematic. In addition to the potential for solder migration to the chip sidewalls, in a lateral chip the solder may also migrate into the area between the n- and p-electrodes located on the same side of the chip. Such migration again has the potential to produce parasitic or shorting paths. Again, resort is sometimes made to thermocompressive bonding, thermosonic bonding, or another non-solder based bonding technique.

Problems of solder migration are also affected by mechanical tolerances of the fabrication equipment or processes. Because relative misalignment of the solder and chip enhances the likelihood of forming parasitic or shorting solder pathways, it is advantageous to use solder application and chip placement machines having tight tolerances. This, however, increases fabrication costs, and additionally there are practical limits to the achievable tolerances. Requiring tight tolerances on solder application chip placement can also adversely affect yield by causing more devices to fail to meet specification.

Apart from the aforementioned problems, another difficulty with soldering is that it can produce a high chip profile in the fabricated device. The height of the chip is a combination of the chip thickness and the height of the solder bumps. Laser lift-off or other substrate removal or thinning techniques can reduce the chip profile, but only by the thickness of the substrate.

BRIEF DESCRIPTION

In at least one of the described and illustrated example device embodiments, a light emitting device is disclosed, including a light emitting chip, a support, and an electrically conductive chip attachment material. The light emitting chip includes a stack of semiconductor layers and an electrode disposed on the stack of semiconductor layers. The support has a generally planar surface supporting the light emitting chip. The generally planar surface includes a chip cavity having a first depth and first lateral area sized to receive at least the electrode and the stack of semiconductor layers of the light emitting chip, an attachment material cavity disposed in the chip cavity and having a second depth larger then the first depth and second lateral area smaller than the first lateral area, and an electrically conductive path disposed on the generally planar surface to provide external electrical communication with the attachment material cavity from outside the chip cavity. The electrically conductive chip attachment material is disposed in the attachment material cavity and does not extend outside the chip cavity. The electrically conductive chip attachment material provides electrical communication between the electrode of the light emitting chip and the electrically conductive path of the support.

In at least one of the described example method embodiments for fabricating a light emitting device, there is formed on a generally planar surface of a support: (i) a chip cavity having a first depth and first lateral area sized to receive at least an electrode and a stack of semiconductor layers of a light emitting chip; (ii) an attachment material cavity in the chip cavity having a second depth larger then the first depth and second lateral area smaller than the first lateral area; and (iii) an electrically conductive path on the generally planar surface to provide external electrical communication with the attachment material cavity from outside the chip cavity. An electrically conductive chip attachment material is disposed in the attachment material cavity. The light emitting chip including the stack of semiconductor layers and the electrode disposed on the stack of semiconductor layers is placed on the generally planar surface of the support with the electrode and the stack of semiconductor layers in the chip cavity and the electrode generally aligned with the electrically conductive chip attachment material in the attachment material cavity.

In at least one of the described and illustrated example device embodiments, a light emitting device is disclosed, including a light emitting chip, a support, and an electrically conductive chip attachment material. The light emitting chip includes a stack of semiconductor layers and an electrode disposed on the stack of semiconductor layers. The support has a generally planar surface supporting the light emitting chip in a flip-chip fashion. The electrically conductive chip attachment material is recessed into the generally planar surface of the support such that the attachment material does not protrude substantially above the generally planar surface of the support. The attachment material provides electrical communication between the electrode of the light emitting chip and an electrically conductive path of the support.

BRIEF DESCRIPTION OF THE DRAWINGS

The drawings depict example illustrated embodiments. The drawings are diagrammatic representations, and are not to scale or proportion.

FIGS. 1 and 2 diagrammatically show top and side sectional views, respectively, of a support for a light emitting chip. The side sectional view of FIG. 2 is taken along the section line S-S indicated in FIG. 1.

FIG. 3 diagrammatically shows the side sectional of the support with solder material disposed in the attachment material cavity and a side view of a light emitting chip aligned for flip-chip bonding.

FIG. 6 diagrammatically shows a side sectional view of a support, having a chip cavity and two attachment material cavities, for a lateral light emitting chip.

FIG. 7 diagrammatically shows a light emitting package with a lateral light emitting diode chip (shown in side view) and the support (shown in side sectional view) of FIG. 6 having chip and attachment material cavities. An optional substrate is shown in phantom by dotted lines.

FIG. 8 diagrammatically shows a side sectional view of a support, having an attachment material cavity but no chip cavity, for mounting a lateral light emitting chip.

DETAILED DESCRIPTION

Figure 4:
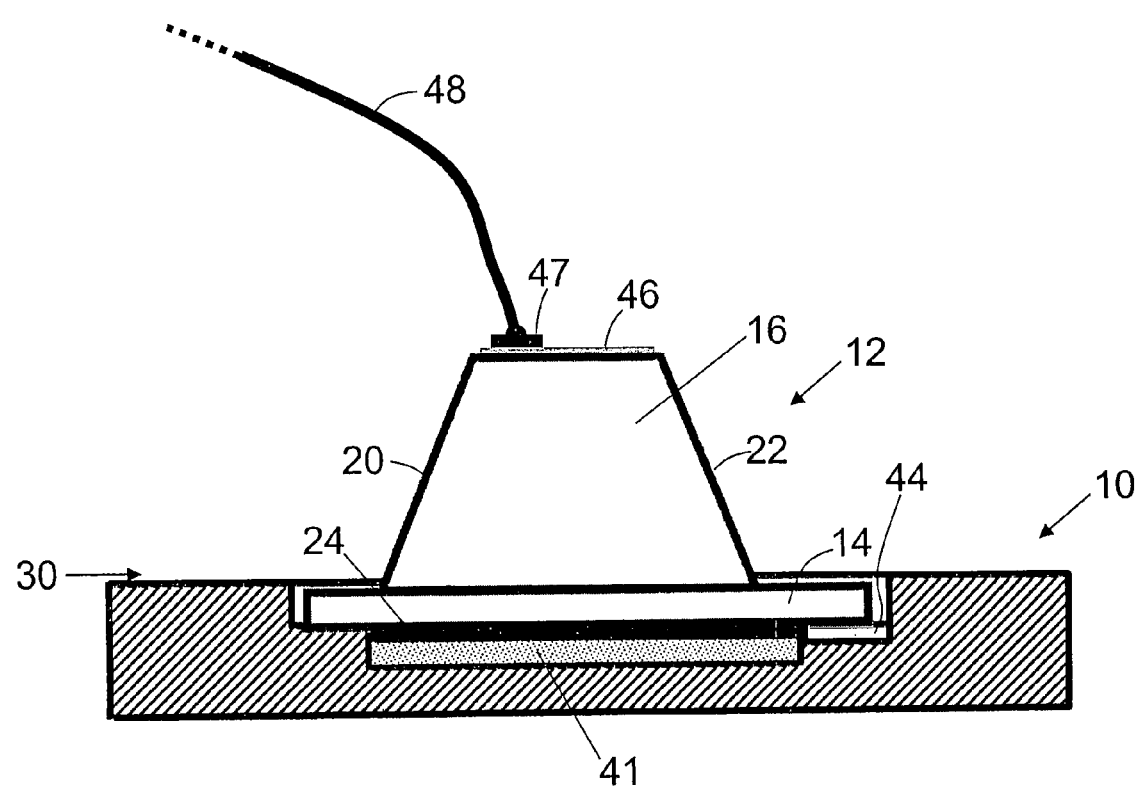
FIG. 4 diagrammatically shows a side partial sectional view of light emitting package with a vertical light emitting diode chip formed from the chip (shown in side view) and support (shown in side sectional view) of FIG. 3.

With reference to FIGS. 1-3, a support 10 for a light emitting chip 12 is described. The support 10 may be a sub-mount, chip carrier, portion of a printed circuit board, or so forth. The light emitting chip 12 includes a stack of semiconductor layers 14. The illustrated light emitting chip 12 further includes a substrate 16. For example, the light emitting chip 12 may be formed by epitaxially depositing the stack of semiconductor layers 14 as a plurality of crystalline semiconductor layers defining a light emitting pn junction on the substrate 16, which in such an embodiment is a crystalline substrate having a lattice constant matching or approximately matching the lattice constant of the stack of semiconductor layers 14. In some example embodiments, the substrate 16 is a sapphire, silicon carbide, or gallium nitride substrate, and the stack of epitaxial layers 14 is a stack of group III-nitride layers such as gallium nitride layers, aluminum nitride layers, indium nitride layers, ternary or quaternary alloy thereof, or so forth. In other example embodiments, the substrate is a gallium phosphide substrate and the stack of group III-nitride layers are group III-phosphide or group III-arsenide layers.

In a typical fabrication process, the epitaxial deposition is performed on a relatively large substrate wafer such as a wafer having lateral dimensions of order inches, and the light emitting chip 12 is formed by breaking the substrate wafer into smaller individual chips for example having lateral dimensions of order millimeters. The substrate wafer may be broken (sometimes called dicing) into individual chips using scribe-and-break, laser cutting, or another suitable technique. The substrate 16 is a light transmissive substrate such that light generated in the stack of semiconductor layers 14 is extracted through the light-transmissive substrate 16. In other contemplated embodiments, light transmission is enabled by removing or substantially thinning the substrate. For example, a laser lift-off process can be used to remove a sapphire substrate for a stack of semiconductor layers including group III-nitride layers. In the illustrated embodiment, the light-transmissive substrate 16 is not removed, but is shaped during or after dicing to have tapered sidewalls 20, 22 that promote light extraction. Such shaping of the sidewalls is to be understood to be optional.

The light emitting chip 12 includes an electrode 24 formed on a principal side of the stack of semiconductor layers 14 opposite the side on which the substrate 16 is attached. The electrode 24 is typically a metal layer or a plurality of metal layers selected to provide a highly electrically conductive contact with the stack of semiconductor layers 14. A nonmetallic layer or layers providing suitable electrically conductive contact may also be used. In some embodiments a portion of the electrode 24 is defined by epitaxially deposited semiconductor layers such as a heavily doped degenerate semiconductor layer that promotes formation of a quasi-ohmic electrical contact. The metal layers of the electrode 24 are suitably deposited on the stack of semiconductor layers 14 either before or after dicing of the substrate wafer.

With continuing reference to FIGS. 1-3, the support 10 includes a generally planar surface 30 for supporting the light emitting chip 12 in a flip-chip configuration. The generally planar surface 30 includes a chip cavity 32 having a first depth $d_{cc}$ (labeled in FIG. 2) and first lateral area (for example, defined in part by a lateral dimension $L_{cc}$ labeled in FIG. 1) sized to receive at least the electrode 24 and the stack of semiconductor layers 14 of the light emitting chip 12. The generally planar surface 30 further includes an attachment material cavity 34 disposed in the chip cavity 32 and having a second depth $d_{am}$ (labeled in FIG. 2) larger then the first depth $d_{cc}$ and second lateral area (for example, defined in part by a lateral dimension $L_{am}$ labeled in FIG. 1) smaller than the first lateral area of the chip cavity 32.

As will be described, the attachment material cavity 34 receives and holds an attachment material such as a solder material for the flip chip bonding. An electrically conductive path 36 is disposed on the generally planar surface 30 to provide external electrical communication with the attachment material cavity 34 from outside the chip cavity 32, for example from an outer bonding pad 38 disposed on the generally planar surface 30 at a point away from the chip and attachment material cavities 32, 34. In the illustrated embodiment, the electrically conductive path 36 is a conductive trace of metal, such as copper, titanium, gold, alloys thereof, or so forth, deposited in a lithographically defined area on the generally planar surface 30, and the illustrated electrically conductive path 36 overlaps only a portion of the attachment material cavity 34. In other embodiments, the electrically conductive path may be a conductive trace that substantially overlaps the entire bottom, and optionally the sidewalls, of the attachment material cavity 34.

As shown in FIG. 3, before placement of the light emitting chip 10, an electrically conductive chip attachment material 40, such as a solder material, silver-filled epoxy material, or so forth, is disposed in the attachment material cavity 34, for example using an automated high-speed solder application machine, manual solder material deposition, or so forth. The light emitting chip 10 is then bonded to the generally planar surface 30 of the support 10 in flip-chip fashion, with the stack of semiconductor layers 14 contacting and bonding to the support 10 and the substrate 16 positioned away from or distal from the support 10. The chip placement is such that the electrode 24 is placed into contact with the electrically conductive chip attachment material 40. In some embodiments, at least one additional process operation is performed after placement of the chip 10 that improves at least one of the mechanical bond or the electrical contact. In the case of a solder material, the at least one additional process operation typically includes a thermal solder reflow process operation. In the case of a silver-filled epoxy material, the at least one additional process operation typically includes a curing operation that may for example be time-based, thermal heating-based, light-based, or so forth.

As shown in FIG. 4, in some embodiments the at least one additional process operation shapes of the electrically conductive chip attachment material 40, for example to produce processed chip attachment material 41 that better fills the attachment material cavity 34. In the case of a solder material, the solder reflow process may produce partial melting or softening of the solder that causes the solder material to change shape from the initial deposit 40 to the final reflowed solder material 41. In some embodiments, the at least one additional process operation also causes emission of gas or vapor from the electrically conductive chip attachment material 40, 41 in the attachment material cavity 32. For example, solder reflow can generate solder flux fumes.

With reference to FIGS. 1-4, in some embodiments the support 10 further includes one or more exhaust openings 44 that provide a path for egress of the emitted gas or vapor out of the attachment material cavity 32. In the illustrated embodiment, eight exhaust openings 44 are defined as eight grooves or slots in the bottom surface of the chip cavity 32 distributed around the attachment material cavity 34 and in fluid communication with both the attachment material cavity 34 and space outside of the chip cavity 32. In other embodiments, the exhaust openings may be holes or tunnels drilled through the support 10 to provide fluid communication between the attachment material cavity and the exterior of the support 10. The exhaust openings 44 are optionally omitted, for example If the at least one additional process operation produces sufficiently limited amounts of gas or vapor, or if the attachment material cavity 34 includes sufficient space to accommodate and perhaps re-condense the generated gas or vapor.

With reference to FIG. 4, the light emitting package including the vertically configured chip 12 further includes a backside electrode 46, 47 disposed on the substrate 16 (in the illustrated embodiment of FIG. 4) or more generally disposed a side of the stack of semiconductor layers 14 opposite from the support 10. The illustrated backside electrode 46, 47 includes a thin transparent electrode portion 46, such as a thin conductive layer or plurality of layers that is light transmissive due to being sufficiently thin (for example, a metal film of thickness less than or about a few nanometers) and/or due to being made of a light transmissive material such as indium tin oxide (ITO). The illustrated backside electrode 46, 47 further includes a bonding site 47 that is typically made of a thicker layer or plurality of layers of highly conductive material such as gold or silver. A wire bonded metallic fiber 48 (shown in part in FIG. 4) or other conductive connection is secured to the bonding site 47. The vertically configured light emitting chip 12 is energized by applying a suitable electrical bias or potential between the flip-chip electrode 24 (via bonding pad 38, electrically conductive path 36, and electrically conductive attachment material 41) and the backside electrode 46, 47 (via wire bonded metallic fiber 48).

Although not shown, it is to be appreciated that if the support 10 is a sub-mount or chip carrier, then the light emitting package shown in FIG. 4 may itself be secured to a printed circuit board or other larger component and suitably electrically connected via the conductive fiber 48 and bonding pad 38. On the other hand, in some embodiments the illustrated support 10 may be a portion of a larger component such as a printed circuit board or other component. In some embodiments, the support 10 is a silicon wafer or chip, and the chip and attachment material cavities 32, 34 and optional exhaust openings 44 are formed by lithographically delineated dry and/or wet etching processes. For example, dry etching techniques with etch rates of 0.5-0.8 microns/minute using silicon dioxide etch masks are suitable. Alternatively, micromachining techniques can be used to fabricate these features, for example using laser drilling, mechanical machine processing, or so forth. In some typical embodiments, the depth $d_{cc}$ of the chip cavity 32 is suitably about 10-15 microns which corresponds approximately with typical thicknesses for a typical stack of semiconductor layers defining a light emitting pn diode, while the depth $d_{am}$ of the attachment material cavity 34 is typically about 45-60 microns. These are illustrative example values—the depths $d_{cc}, d_{am}$ are suitably designed based on the actual dimensions of the light emitting chip and the amount and type of attachment material that is to be used. In the case of a solder material, the optional exhaust openings 44 are preferably less than or about 30 micron×30 micron so as to limit penetration of the solder material into the exhaust openings 44 during the solder application and reflow processes, while allowing sufficient fluid communication for egress of flux vapors during the solder reflow process. If the material of the support 10 is electrically conductive, then the sidewalls of the chip cavity 32 are suitably coated with a dielectric material to provide electrical isolation.

The amount of the electrically conductive chip attachment material 40, 41 disposed in the attachment material cavity 34 is selected such that, even after the solder reflow, curing, or other additional processing, the attachment material 41 does not extend outside the chip cavity 32. Thus, the electrically conductive chip attachment material 41 does not overflow onto the sidewalls or substrate of the light emitting chip 12 so as to produce parasitic electrically conductive paths or shorting. In the illustrated embodiment, even after the solder reflow, curing, or other additional processing the attachment material 41 remains disposed in the attachment material cavity 34 and does not extend outside the attachment material cavity 34.

Figure 5:
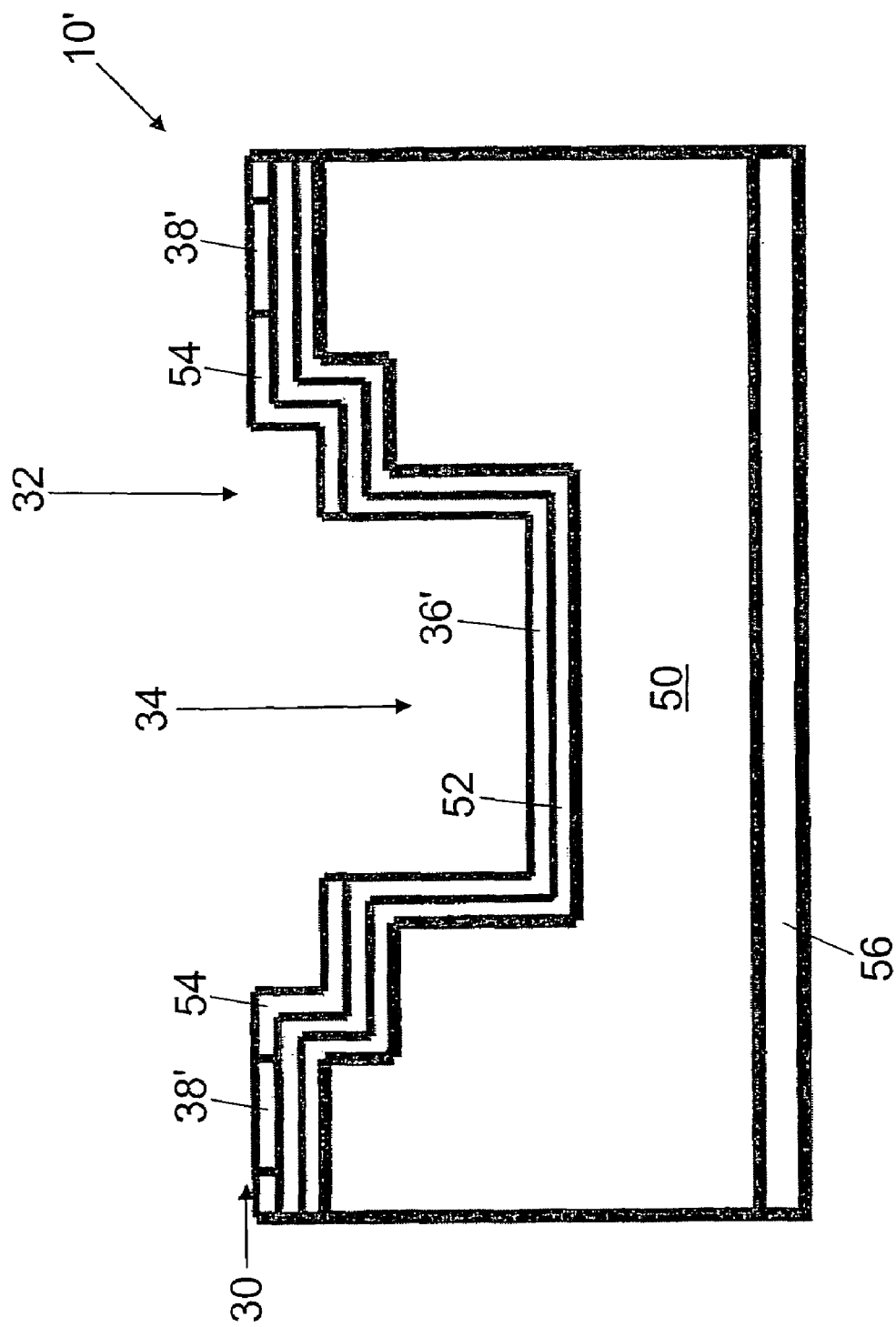
FIG. 5 diagrammatically shows a side sectional view of a support including chip and attachment material cavities. For simplicity, in the side sectional view of FIG. 5 the different materials are not indicated by different shadings.

With reference to FIG. 5, a suitable configuration for a variant support 10' made of a silicon wafer 50 is described. After etching to form the chip and attachment material cavities 32, 34 (and the optional exhaust openings, not shown in the support 10' of FIG. 5) a passivating silicon dioxide layer 52 is applied over the entire generally planar surface 30 including the sidewalls and bottoms of the chip and attachment material cavities 32, 34. An electrically conductive path 36' of titanium, gold, a multilayer stack of titanium and gold layers, or so forth is applied. In the support shown in FIG. 5, the electrically conductive path 36' is applied over the entire generally planar surface 30 including the sidewalls and bottoms of the chip and attachment material cavities 32, 34. (In contrast, in the example of FIG. 1 the electrically conductive path 36 is applied in only selected regions.) An additional passivating silicon dioxide layer 54 is selectively applied to electrically insulate the sidewalls and bottom of the chip cavity 32 and the generally planar surface 30 except in regions such as outer bonding pad 38'. Optionally, a thermally conductive layer 56 such as a gold-tin solder layer is applied to the bottom of the support 10' to solder or otherwise thermally conductively connect the support 10' to an underlying component (not shown). For example, the support 10' may be a sub-mount or chip carrier, and the illustrated thermally conductive layer 56 of a gold-tin solder used to solder the sub-mount or chip carrier to a printed circuit board or other component.

With reference to FIGS. 6 and 7, an embodiment employing a support 110 lateral light emitting chip 112 is described. The lateral light emitting chip 112 includes the stack of semiconductor layers 14 and an optional substrate 116 that corresponds to the substrate 16 of the vertical configuration chip 12. In the case of the lateral chip 112, both n-type and p-type electrodes 124, 125 are disposed on the same side of the stack of semiconductor layers 14 as the support 110, and the backside electrode 46, 47 of the lateral configuration is omitted. Because the optional substrate 116 is not used for electrical conduction, it can be either electrically insulating or electrically conductive. In some embodiments, the substrate is initially present as a template for epitaxial growth of the stack of semiconductor layers 14, and is then removed by laser lift-off or another process after flip-chip bonding of the lateral chip 112 to the support 110.

The support 110 includes the generally planar surface 30 and the chip cavity 32 formed into the generally planar surface 30. However, because the later light emitting chip 112 includes two electrodes 124, 125 of opposite polarity (e.g., n-type and p-type) on the same side of the stack of semiconductor layers 14, there are a corresponding two attachment material cavities 134, 135 formed in the generally planar surface 30 of the support 110. The attachment material cavities 134, 135 are filled with attachment material that is optionally processed by the at least one additional process operation to form attachment material 141, 142 in respective attachment material cavities 134, 135. For example, the attachment material 141, 142 may be solder material disposed in the attachment material cavities 134, 135 followed by a solder reflow process after the lateral light emitting chip 112 is placed into position in the chip cavity 32. The attachment material 141 electrically contacts the electrode 124, while the attachment material 142 electrically contacts the electrode 125. Separate electrically conductive paths (not shown in FIGS. 6 and 7) are disposed on the generally planar surface 30 to provide separate external electrical communication with the attachment material cavities 141, 142 from outside the chip cavity 32 to enable electrically powering the lateral light emitting chip 112. Moreover, an underfill material 150 is optionally disposed between the stack of semiconductor layers 14 and the generally planar surface 30 of the support 110. The optional underfill material 150 is suitably an epoxy or other electrically insulating material that enhances the mechanical securing of the chip 112 to the support 110.

Figure 9:
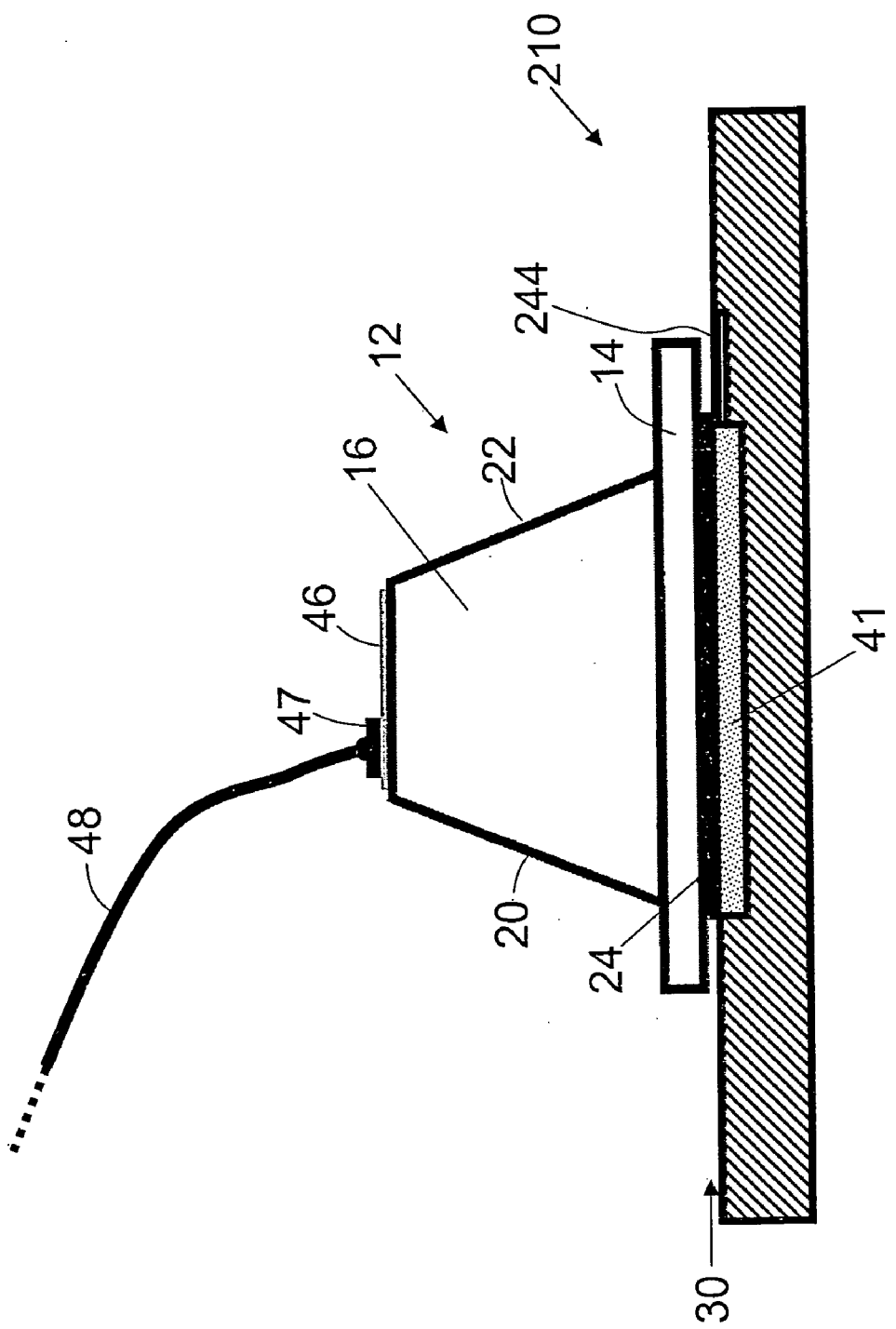
FIG. 9 diagrammatically shows a light emitting package with the vertical light emitting diode chip (shown in side view) of FIGS. 3 and 4 and the support (shown in side sectional view) of FIG. 8.

With reference to FIGS. 8 and 9, a support 210 is similar to the support 10 of FIGS. 1-4, but omits the chip cavity 32. Because of the omission of the chip cavity 32, a modified attachment material cavity 234 differs from the attachment material cavity 34 of the support 10 in that it has a shallower depth $d_{am}'$ that is not as deep as the attachment material cavity 34 since it does not allow for the depth of a chip cavity. As shown in FIG. 9, the vertically configured light emitting chip 12 is attached as before, but is not fitted into a chip cavity. Optionally, one or more exhaust openings 244 are provided as before to enable egress of solder flux fumes or other gas or vapor from the attachment material cavity 234 during solder reflow, silver-filled epoxy material curing, or other processing of the attachment material.

The amount of the electrically conductive chip attachment material 41 disposed in the attachment material cavity 234 is selected such that, even after the solder reflow, curing, or other additional processing, the attachment material 41 does not extend outside the lateral area of the light emitting chip 12. Thus, the electrically conductive chip attachment material 41 does not overflow onto the sidewalls or substrate of the light emitting chip 12 so as to produce parasitic electrically conductive paths or shorting. In the illustrated embodiment, even after the solder reflow, curing, or other additional processing the attachment material 41 remains disposed in the attachment material cavity 234 and does not extend outside the attachment material cavity 234.

The support 210 provides most of the benefits of the support 10. Both supports 10, 210 recess the electrically conductive chip attachment material 41 into the generally planar surface 30 of the support 10, 210 such that the attachment material 41 does not protrude substantially above the generally planar surface 30 of the support 10, 210. This arrangement provides a low device profile by elimination of the height of the bonding bump corresponding to the solder, silver-filled epoxy, or other attachment material. Both supports 10, 210 also provide enhanced containment of the electrically conductive attachment material 41 which reduces a likelihood of parasitic losses or shorting due to overflow of the attachment material onto a sidewall or substrate of the light emitting chip 12. However, the support 210 does not provide passive alignment for the light emitting chip 12, whereas the chip cavity 32 of the support 10 does provide passive chip alignment. Moreover, the chip cavity 32 of the support 10 is expected to provide a kind of secondary containment for the electrically conductive chip attachment material 41 so as to further reduce the likelihood of parasitic losses or shorting due to overflow of the attachment material onto a sidewall or substrate of the light emitting chip 12.

The example embodiments have been described with reference to the drawings. Obviously, modifications and alterations will occur to others upon reading and understanding the preceding detailed description. It is intended that the example embodiments be construed as including all such modifications and alterations insofar as they come within the scope of the appended claims or the equivalents thereof.

The invention claimed is:

1. A light emitting device comprising:
a light emitting chip including a stack of semiconductor layers and an electrode disposed on the stack of semiconductor layers;
a support having a generally planar surface supporting the light emitting chip, the generally planar surface including a chip cavity having a first depth and first lateral area and receiving at least the electrode and the stack of semiconductor layers of the light emitting chip, an attachment material cavity disposed in the chip cavity and having a second depth larger than the first depth and second lateral area smaller than the first lateral area, wherein the attachment material cavity is too small to receive the light emitting chip, and an electrically conductive path disposed on the generally planar surface to provide external electrical communication with the attachment material cavity from outside the chip cavity; and an electrically conductive chip attachment material disposed in the attachment material cavity and not extending outside the chip cavity, the electrically conductive chip attachment material providing electrical communication between the electrode of the light emitting chip and the electrically conductive path of the support;

2. The light emitting device as set forth in claim 1, wherein the stack of semiconductor layers define a light emitting pn junction, and the light emitting chip is a vertical chip further comprising:

an electrically conductive substrate attached to the stack of semiconductor layers with the stack of semiconductor layers disposed between the substrate and the generally planar surface of the support; and a backside electrode disposed on a side of the substrate opposite from the stack of semiconductor layers.

3. The light emitting device as set forth in claim 2, wherein the stack of semiconductor layers include at least one group III nitride semiconductor layer, and the electrically conductive substrate includes a silicon carbide substrate.

4. The light emitting device as set forth in claim 1, wherein the stack of semiconductor layers define a light emitting pn junction, and the light emitting chip is a vertical chip further comprising:

a backside electrode disposed on a side of the stack of semiconductor layers opposite from the support.

5. The light emitting device as set forth in claim 1, wherein the stack of semiconductor layers define a light emitting pn junction, the light emitting chip is a lateral chip in which the electrode comprises at least one n-type electrode and at least one p-type electrode both disposed on the same side of the stack of semiconductor layers, the electrically conductive path includes at least two electrically conductive paths, the attachment material cavity includes at least two spaced apart attachment material cavities, and the electrically conductive chip attachment material comprises:

a first portion of attachment material disposed in a first one or more of the at least two spaced apart attachment material cavities, the first portion of attachment material providing electrical communication between the at least one n type electrode and a first one or more of the at least two electrically conductive paths; and a second portion of attachment material disposed in a second one or more of the at least two spaced apart attachment material cavities, the second portion of attachment material providing electrical communication between the at least one p type electrode and a second one or more of the at least two electrically conductive paths.

6. The light emitting device as set forth in claim 5, wherein the stack of semiconductor layers include at least one group III nitride semiconductor layer.

7. The light emitting device as set forth in claim 6, wherein the light emitting chip further comprises:

a substrate attached to the stack of semiconductor layers with the stack of semiconductor layers disposed between the substrate and the generally planar surface of the support, the substrate being selected from a group consisting of a sapphire substrate, a silicon carbide substrate, and a gallium nitride substrate.

8. The light emitting device as set forth in claim 1, wherein the support further includes at least one exhaust opening providing external fluid communication with the attachment material cavity from outside the chip cavity.

9. The light emitting device as set forth in claim 1, wherein the support comprises a silicon wafer having a principal surface defining the generally planar surface supporting the light emitting chip.

10. The light emitting device as set forth in claim 1, wherein the electrically conductive chip attachment material is a solder material.

11. The light emitting device as set forth in claim 10, wherein the solder material has a shape produced by reflow of the solder material after placement of the light emitting chip on the generally planar surface of the support.

12. A light emitting device comprising:

a light emitting chip including a stack of semiconductor layers and an electrode disposed on the stack of semiconductor layers;

a support having a generally planar surface supporting the light emitting chip in a flip chip fashion; and an electrically conductive chip attachment material recessed into the generally planar surface of the support such that the attachment material does not protrude substantially above the generally planar surface of the support, the attachment material providing electrical communication between the electrode of the light emitting chip and an electrically conductive path of the support;

wherein the light emitting chip is electrically connected in a vertical configuration and further includes a backside electrode disposed on a side of the stack of semiconductor layers opposite from the support.

13. The light emitting device as set forth in claim 12, wherein at least the stack of semiconductor layers and the electrode of the light emitting chip are also recessed into the generally planar surface of the support.

14. The light emitting device as set forth in claim 12, wherein the electrically conductive chip attachment material is a solder material.

15. The light emitting device as set forth in claim 14, wherein the solder material has a shape produced by reflow of the solder material after placement of the light emitting chip on the generally planar surface of the support.

16. The light emitting device as set forth in claim 12, wherein the support further includes at least one exhaust opening providing external fluid communication with the attachment material cavity from outside the attachment material cavity.

17. A light emitting device comprising:

a light emitting chip including a stack of semiconductor layers and an electrode disposed on the stack of semiconductor layers;

a support having a generally planar surface supporting the light emitting chip in a flip chip fashion; and an electrically conductive chip attachment material recessed into the generally planar surface of the support such that the attachment material does not protrude substantially above the generally planar surface of the support, the attachment material providing electrical communication between the electrode of the light emitting chip and an electrically conductive path of the support, wherein the electrically conductive chip attachment material is disposed in at least one attachment material cavity formed into the generally planar surface of the support, and the attachment material cavity is too small to receive the light emitting chip.

18. The light emitting device as set forth in claim 17, wherein the support further includes at least one exhaust opening providing external fluid communication with the attachment material cavity from outside the attachment material cavity.

19. The light emitting device as set forth in claim 17, wherein at least the stack of semiconductor layers and the electrode of the light emitting chip are also recessed into the generally planar surface of the support.

20. The light emitting device as set forth in claim 17, wherein the electrically conductive chip attachment material is a solder material.

21. The light emitting device as set forth in claim 20, wherein the solder material has a shape produced by reflow of the solder material after placement of the light emitting chip on the generally planar surface of the support.

* * * * *